(12) United States Patent
Zook

(10) Patent No.: US 7,126,775 B1
(45) Date of Patent: Oct. 24, 2006

(54) SERVO TRACK ADDRESS CHANNEL CODE FOR D=1 MAGNETIC RECORDING

(75) Inventor: Christopher P. Zook, Longmont, CO (US)

(73) Assignee: Cirrus Logic, Inc., Austin, TX (US)

( * ) Notice: Subject to any disclaimer, the term of this patent is extended or adjusted under 35 U.S.C. 154(b) by 1227 days.

(21) Appl. No.: 08/678,011

(22) Filed: Jul. 10, 1996

Related U.S. Application Data

(63) Continuation of application No. 08/401,605, filed on Mar. 9, 1995, now abandoned.

(51) Int. Cl.
*G11B 5/09* (2006.01)
*G11B 5/596* (2006.01)

(52) U.S. Cl. ...................... 360/49; 360/77.08
(58) Field of Classification Search ............ 360/41, 360/48, 49, 77.08, 78.14
See application file for complete search history.

(56) References Cited

U.S. PATENT DOCUMENTS

| | | | |
|---|---|---|---|
| 4,984,100 A | 1/1991 | Takayama et al. | 360/49 |
| 5,274,510 A | 12/1993 | Sugita et al. | 360/49 |
| 5,384,671 A | 1/1995 | Fisher | 360/51 |
| 5,739,975 A * | 4/1998 | Parks et al. | 360/109 |

OTHER PUBLICATIONS

"Modulation & Coding for Information Storage", IEEE Communications Magazine, Dec. 1991 Siegel et al. p. 68–70.*

* cited by examiner

*Primary Examiner*—Regina Y. Neal
(74) *Attorney, Agent, or Firm*—Steven Lin

(57) ABSTRACT

A rate ½, d=1 channel code encodes a Gray code servo track address into channel data recorded on a magnetic disk; a d=1 Viterbi sequence detector detects the recorded servo track address upon read back; a cost effective d=1 decoder decodes the recorded servo track address into its Gray code representation; and a ¼+D filter decodes the Gray code track address into its binary representation. The channel encoding scheme increases the data density of the storage system due to the d=1 constraint and use of the Viterbi sequence detector. Further, the implementation advantageously uses the Viterbi sequence detector already provided in a read channel for detecting user data, and the cost and complexity of the decoder is reduced by encoding/decoding the Gray code track address in sections of five bits.

21 Claims, 7 Drawing Sheets

| BINARY TRACK NUMBER | GRAY CODE | CHANNEL DATA |
| --- | --- | --- |
| 000 | 1111 | 11111111 |
| 001 | 1110 | 11111100 |
| 010 | 1010 | 11001100 |
| 011 | 1011 | 11001111 |
| 100 | 1001 | 11000011 |
| 101 | 1101 | 11110011 |
| 110 | 0101 | 00110011 |
| 111 | 0111 | 00111111 |

| BINARY TRACK NUMBER | GRAY CODE | CHANNEL DATA |
| --- | --- | --- |
| 000 | 000 | 100100100 |
| 001 | 001 | 100100010 |
| 010 | 011 | 100010010 |
| 011 | 010 | 100010100 |
| 100 | 110 | 010010100 |
| 101 | 111 | 010010010 |
| 110 | 101 | 010100010 |
| 111 | 100 | 010100100 |

| TRACK NUMBER | GRAY CODE | CHANNEL DATA |
|---|---|---|
| 00000 | 00000 | 0001001010 |
| 00001 | 00001 | 0010001010 |
| 00010 | 00011 | 0100001010 |
| 00011 | 00010 | 1000001010 |
| 00100 | 00110 | 1000010010 |
| 00101 | 00111 | 0100010010 |
| 00110 | 00101 | 0010010010 |
| 00111 | 00100 | 0001010010 |
| 01000 | 01100 | 0001010100 |
| 01001 | 01101 | 0010010100 |
| 01010 | 01111 | 0100010100 |
| 01011 | 01110 | 1000010100 |
| 01100 | 01010 | 1000100100 |
| 01101 | 01011 | 0100100100 |
| 01110 | 01001 | 0010100100 |
| 01111 | 01000 | 0010101000 |
| 10000 | 11000 | 0100101000 |
| 10001 | 11001 | 1000101000 |
| 10010 | 11011 | 1001001000 |
| 10011 | 11010 | 0101001000 |
| 10100 | 11110 | 0101010000 |
| 10101 | 11111 | 1001010000 |
| 10110 | 11101 | 1010010000 |
| 10111 | 11100 | 1010001000 |
| 11000 | 10100 | 1010000100 |
| 11001 | 10101 | 1001000100 |
| 11010 | 10111 | 0101000100 |
| 11011 | 10110 | 0101000010 |
| 11100 | 10010 | 1001000010 |
| 11101 | 10011 | 1000100010 |
| 11110 | 10001 | 0100100010 |
| 11111 | 10000 | 0010100010 |

MAGNETIC FLUX TRANSITIONS

| BINARY TRACK NUMBER | GRAY CODE |
|---|---|
| 000000000000000 | 00000 00000 00000 |
| 000000000000001 | 00000 00000 00001 |
| 000000000000010 | 00000 00000 00011 |
| ⋯ | ⋯ |
| 000000000011101 | 00000 00000 10011 |
| 000000000011110 | 00000 00000 10001 |
| 000000000011111 | 00000 00000 10000 |
| 64→ 000000000100000 | 00000 00001 10000 |
| 68→ 000000000100001 | 00000 00001 10001 |
| 000000000100010 | 00000 00001 10011 |
| ⋯ | ⋯ |
| 000000000111101 | 00000 00001 00011 |
| 000000000111110 | 00000 00001 00001 |
| 000000000111111 | 00000 00001 00000 |
| 70→ 000000001000000 | 00000 00011 00000 |
| 000000001000001 | 00000 00011 00001 |
| 000000001000010 | 00000 00011 00011 |
| ⋯ | ⋯ |
| 000000001011101 | 00000 00011 10011 |
| 000000001011110 | 00000 00011 10001 |
| 000000001011111 | 00000 00011 10000 |
|  | ↑66   ↑62 |

*FIG. 6*

SERVO TRACK ADDRESS CHANNEL CODE FOR D=1 MAGNETIC RECORDING

This application is a continuation of Ser. No. 08/401,605 filed Mar. 9, 1995, abandoned.

FIELD OF INVENTION

The present invention relates to magnetic disk storage systems for digital computers, and particularly, to a novel method and apparatus for addressing a plurality of servo tracks recorded on the magnetic disk.

BACKGROUND OF THE INVENTION

In magnetic disk storage systems for computers, digital data serves to modulate the current in a read/write head coil so that a sequence of corresponding magnetic flux transitions are written onto the surface of the magnetic disk in a series of concentric tracks. When reading this recorded data, the read/write head again passes over the magnetic disk and transduces the magnetic transitions into pulses in an analog signal that alternate in polarity. These pulses are then decoded by read channel circuitry to reproduce the digital data.

The read/write head is normally mounted on an actuator arm which is positioned by means of a DC brushless motor (and typically a voice coil motor "VCM". A servo system controls the VCM, and thereby the head position, necessary for reading and writing information in response to requests from a host computer connected to the disk drive. The servo system performs two functions: (1) a "seek" or "access" function in which the servo system moves the head to a selected track; and (2) when the head reaches the selected track, a "track following" or "tracking" function in which it accurately positions the head over a centerline of the track and maintains that position as successive portions of the track pass by the head. Servo control information embedded within the data provides inter-track head position information so that a head position error, indicative of a difference between the actual head position and the desired head position, can be computed. In response to the head position error, the servo control system generates a VCM control signal to align the head over the centerline of the selected track, thereby driving the head position error to zero.

The embedded servo control information recorded on the magnetic disk typically includes a servo track address field for course positioning of the read/write head, and a burst field for fine positioning over a centerline of the selected track. During a seek operation, when the servo controller is moving the read/write head to a new track, the track address identifies the current track passing under the head. The current track address is detected by the read head, decoded by the read channel circuitry, and transmitted to the servo controller. The servo controller compares the current track address with a target track address to generate a track position error. The track position error is converted into an actuator control signal for controlling the velocity of the head as it approaches the target track. Once the read head arrives at the target track, the servo controller switches into a tracking mode and processes the servo burst fields in order to maintain the head over the track's centerline.

As shown in FIGS. 1A and 1B, the servo data 2 is recorded on the magnetic disk 4 as radial spokes of information embedded within the circular tracks. The tracks, arranged from an inner track 6 to an outer track 8, comprise a plurality of sectors 10 for recording user data. As previously described, the servo data 2 includes a track address field 12 and a servo burst field 14. During a seek operation, as the read/write head traverses the magnetic disk toward the target track at a very high speed, a track address might be detected as part of a current track and part of the next adjacent track. Unless adjacent track addresses are different by only one bit, the detected track address will be grossly incorrect. Therefore, the track address cannot be recorded in its direct binary representation since more than one bit would change between adjacent tracks (e.g., track #4=0100 and track #3=0011 might be detected as track #7=0111).

Normally, a Gray code encodes the track address before it is recorded onto the disk to ensure that adjacent addresses is differ by only one bit. The Gray code is further encoded to ensure that the recorded channel data of adjacent track addresses differ in only two adjacent bits (i.e., the flux pattern of adjacent track addresses differs in an area equal to the width of one bit cell.) After a track address is detected, it is converted from its Gray code representation back into its binary representation, then subtracted from the target track address to generate the head position error.

In conventional peak detection read channels, analog circuitry, responsive to threshold crossing or derivative information, detects peaks in the continuous time analog read signal. The analog read signal is "segmented" into bit cell periods and interpreted during these segments of time. The presence of a peak during the bit cell period represents a "1" bit, whereas the absence of a peak represents a "0" bit. The most common errors in detection occur when the bit cells are not correctly aligned with the analog pulse data. Timing recovery, then, adjusts the bit cell periods so that the peaks occur in the center of the bit cells on average in order to minimize detection errors. Since timing information is derived only when peaks are detected, the input data stream is normally run length limited (RLL) to limit the number of consecutive "0", bits. The input data stream is also frequently RLL encoded to limit the spacing of "1" bits so as to minimize the undesirable effect of inter-symbol interference (ISI).

An RLL code denoted (d,k) encodes the input data stream such that at least d "0" bits occur between each "1" bit and no more than k "0" bits occur consecutively. A typical RLL (1,7) rate ⅔ code encodes 2 input data bits into 3 codeword bits recorded on the disk. The user data to codeword rate ⅔ in this example) is an important factor in the overall storage capacity of the disk drive. As the rate approaches unity, more user data is stored to the disk rather than codeword data. Although, the d=1 constraint decreases the codeword rate, it also allows a faster write frequency and thereby allows more codeword data to be written to the disk. In fact, a d=1 rate ⅔ code allows more user data to be stored on the disk than a d=0 code at any rate assuming both systems use the same minimum distance between flux transitions on the disk.

A d=1 recording system, however, requires a more sophisticated method for encoding and decoding the data. As a result, prior art recording systems have used a d=1 constraint for user data but not for the servo data. Disk storage designers have opted to use less complex, less expensive, and slower servo detectors rather than a d constraint even though the d constraint can increase the overall data density of the storage system. This has not been a problem in the past due to the marginal gain in density that a d constraint would have provided. Prior art storage systems, such as that disclosed by Moon et al. in U.S. Pat. No. 4,783,705, advantageously use the same peak detection circuitry for detecting user data and servo data, thereby reducing the system's cost and complexity.

With the dramatic increase in data density for magnetic disk storage systems and especially with the advent of partial response maximum likelihood (PRML) Viterbi sequence detection, encoding the servo data with a d=1 constraint can provide a more than marginal improvement. This improvement is even more significant in ID-Less storage systems where the size of the servo field has been expanded in order to store sector identifying information. However, unless the servo data is recorded with a d=1 constraint, a d=1 Viterbi sequence detector in a PRML read channel cannot be used to detect the servo data. Instead, a separate peak detector would be required which is highly inefficient.

What is needed is a cost effective solution to encoding and decoding servo data with a d=1 constraint in order to take advantage of the resulting increase in data density. It is a further object to use the Viterbi sequence detector in PRML read channels for detecting both user data and servo data rather than employ a separate peak detector for detecting the servo data.

SUMMARY OF THE INVENTION

The present invention increases the data density of a magnetic disk storage system using a cost effective implementation for encoding, detecting, and decoding servo track addresses. An optimum rate ½ RLL (1,k) code encodes the Gray code track addresses into channel data that is recorded onto the magnetic disk. During read back, a Viterbi sequence detector detects the servo data, and an RLL (1,k) decoder decodes the channel data back into the Gray code track address. By compensating for inter-symbol interference, a Viterbi sequence detector increases the effective signal to noise ratio and thereby the data density. Further, it is more cost effective to use the Viterbi detector to detect the servo data since it is already incorporated into the read channel for detecting user data.

In operation, a 1+D filter encodes a 15 bit binary representation of the track address into a 15 bit Gray code. An RLL (1,k) encoder encodes the 15 bit Gray code into a 30 it servo track address that is recorded onto the disk. Upon read back, a d=1 sequence detector, such as a Viterbi sequence detector, detects the recorded servo data, and an RLL (1,k) decoder decodes the 30 bit servo track address back into the corresponding 15 bit Gray code. Then, a 1/(1+D) filter converts the 15 bit Gray code back into the corresponding 15 bit binary track address. A servo controller subtracts the decoded binary track address from a target track address to generate a position error for controlling the velocity of the read/write head as it approaches the selected track.

The present invention achieves two design criteria maximizing the user data density, and minimizing the RLL (1,k) servo decoder's complexity and cost. Encoding the Gray code address using an efficient code rate and detecting the servo data with a Viterbi sequence detector achieves the first criteria, while decoding the RLL (1,k) codeword in a predetermined number of sections achieves the second criteria.

For an RLL (1,k) constraint, the optimal code rate is 5/10; 5 bits of Gray code track address are encoded into 10 bits of RLL (1,k) encoded servo track address (rate ½). More than 5 Gray code bits can be encoded at a time to achieve a code rate better than ½, but the resulting improvement in data density does not outweigh the increased cost in decoder complexity. Also, it is not possible to achieve a code rate greater than ½ by encoding less than 5 Gray code bits at a time. The 5/10 limitation is due to the inherent requirement that the channel data of adjacent track addresses differ in only two adjacent bits.

In order to reduce the complexity of the RLL (1,k) servo decoder, a 30 bit RLL (1,k) codeword representing the servo track address is decoded in three sections where each section comprises 10 bits each. The three 10 bit codeword sections are decoded into three 5 bit Gray code sections which are concatenated into a 15 bit Gray code. In this manner, a single RLL decoder can decode each 10 bits of codeword into 5 bits of Gray code rather than decoding 30 bits of codeword into 15 bits of Gray code. This reduces the complexity and cost of the decoder.

The above, and other advantages of the present invention will be understood from the following detailed description of the preferred embodiment and accompanying illustrative drawings wherein like numerals refer to similar parts in the several views.

BRIEF DESCRIPTION OF THE DRAWINGS

FIG. 6 shows the intermediate step of encoding the binary track address into a Gray code such that only one of three 5 bit sections of the track address changes between adjacent track addresses.

DETAILED DESCRIPTION OF THE DRAWINGS

Figure 1A:
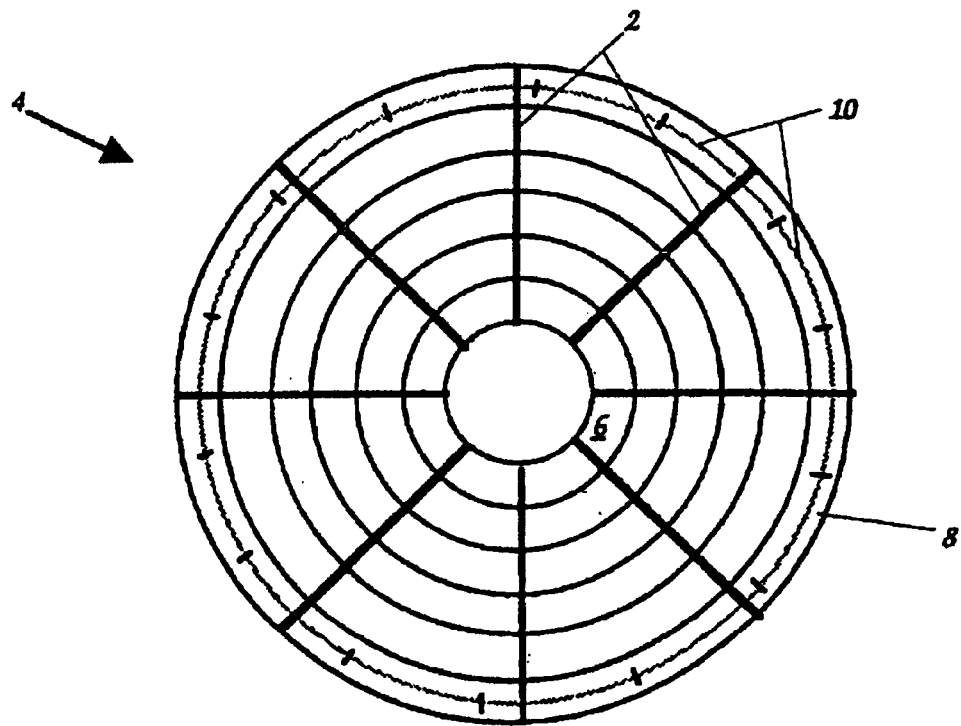
FIGS. 1A and 1B show a conventional magnetic disk data format comprised of a plurality of concentric data tracks having embedded servo data in the form of radial spokes.
Figure 1B:
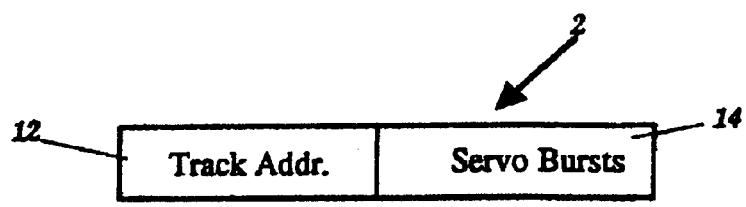

FIGS. 1A and 1B show an exemplary data format of a magnetic disk 4 comprising a plurality of concentric data tracks from an inner track 6 to an outer track 8. Each data track comprises a plurality of sectors 10 having a plurality of servo fields 2 embedded therein. A servo controller processes the servo field 2 to verify the track address 12 of a read/write head in order to position the head over a selected track. Once the read/write head reaches the selected track, the servo controller processes servo bursts 14 within the servo field 2 to keep the head aligned over the track's centerline while writing and reading data.

Figure 2:
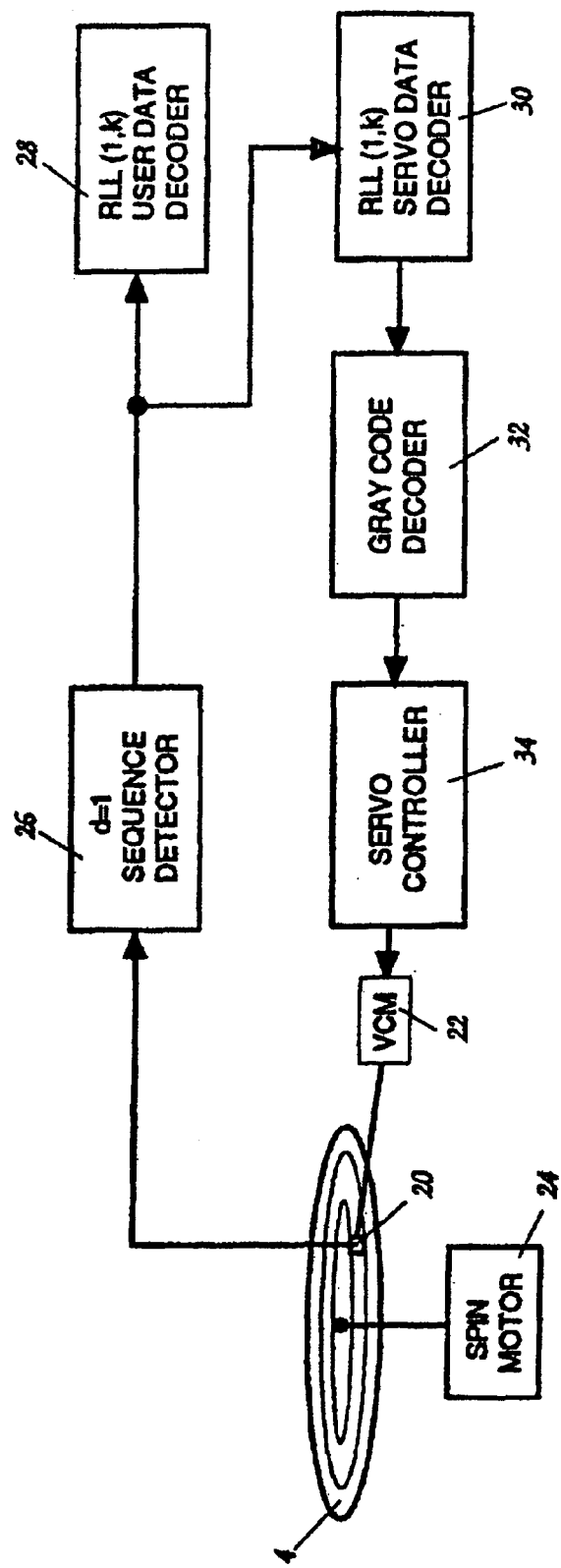
FIG. 2 is a block diagram of the read channel incorporating a d=1 sequence detector, a first RLL (1,k) decoder for decoding user data, and a second RLL (1,k) decoder for decoding servo data.

FIG. 2 is a block diagram of the magnetic storage system of the present invention. The magnetic disk 4, with the servo data recorded thereon, has a read/write head 20 positioned over its surface by means of a voice coil motor (VCM) 22 and is rotated at a very high speed by means of a spin motor 24. A d=1 sequence detector 26, responsive to the read signal from the read/write head 20, detects and outputs the encoded binary user data and servo data recorded on the disk. In the preferred embodiment, the d=1 sequence detector 26 is a Viterbi type sequence detector such as the one disclosed by Glover et al. in U.S. Pat. No. 5,291,499, the disclosure of which is herein incorporated by reference. A first d=1 decoder 28 decodes the user data, and a second d=1 decoder 30 decodes the servo data into Gray coded track addresses. A Gray decoder 32 decodes the Gray code track address into the corresponding binary track address which is then transmitted to a servo controller 34. The servo controller subtracts the binary track address from a target track address to generate a VCM 22 command signal for controlling the velocity of the read/write head 20 as it moves toward the target track.

Figure 3A:
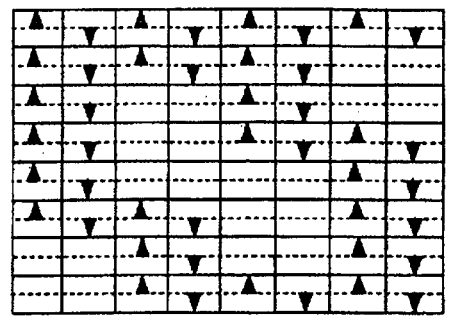
FIG. 3A shows a prior art RLL (0,k) method for encoding Gray code track address into channel data.

Referring now to FIG. 3A, shown is an example prior art method for encoding the binary track address into a Gray code track address and then into channel data. The Gray codes are encoded according to a dibit modulation technique where a "1" bit is encoded into "11" and a "0" bit is encoded into "00". Dibit modulation ensures that the magnetic transitions in adjacent track addresses occur in the same direction as shown in FIG. 3A. The binary track number is encoded into the Gray code at rate 3/4 in order to satisfy an RLL (d,k) constraint (for this example d=0 and k=4). The overall code rate, then, is 3 bits of binary track address encoded into 8 bits of channel data (rate 3/8). Although not a significant problem in the past, a rate 3/8 code has become inefficient for higher density storage systems. Further, dibit modulation cannot be used when a d=1 constraint is required; for instance, when the servo data is detected using a d=1 sequence detector.

Figure 3B:
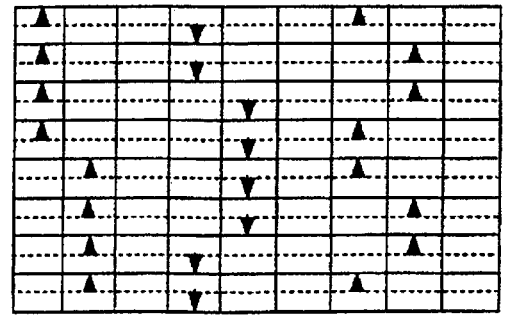
FIG. 3B shows an example embodiment for RLL (1,k) coding the track address into channel data at rate 3/9.

The present invention provides a method for encoding the Gray code addresses having a d=1 constraint. One such method which provides an RLL (1,3) constraint is shown in FIG. 3B. This method encodes a "0" bit of Gray, code into "100" and a "1" bit of Gray code into "010". However, the overall code rate is 3/9 which is still inefficient.

In order to increase the code rate, the encoding method must encode multiple bits of Gray code (rather than one bit at a time) into the channel data recorded on the disk. The channel encoding scheme must also satisfy the following constraints:

1. The channel codewords of adjacent track addresses must be different by only two adjacent bits.
2. There must be at least d number of "0" bits between consecutive "1" bits and no more than k number of consecutive "0" bits (i.e., satisfy the RLL (d,k) constraint).

The first constraint is satisfied by encoding the Gray code track addresses into channel codewords having the same number of "1" bits and by arranging the channel codewords into a sequence such that adjacent codewords are different by a single "1" bit shift. The second constraint is satisfied by encoding a a predetermined number of "1" bits into the codewords.

Figure 4:
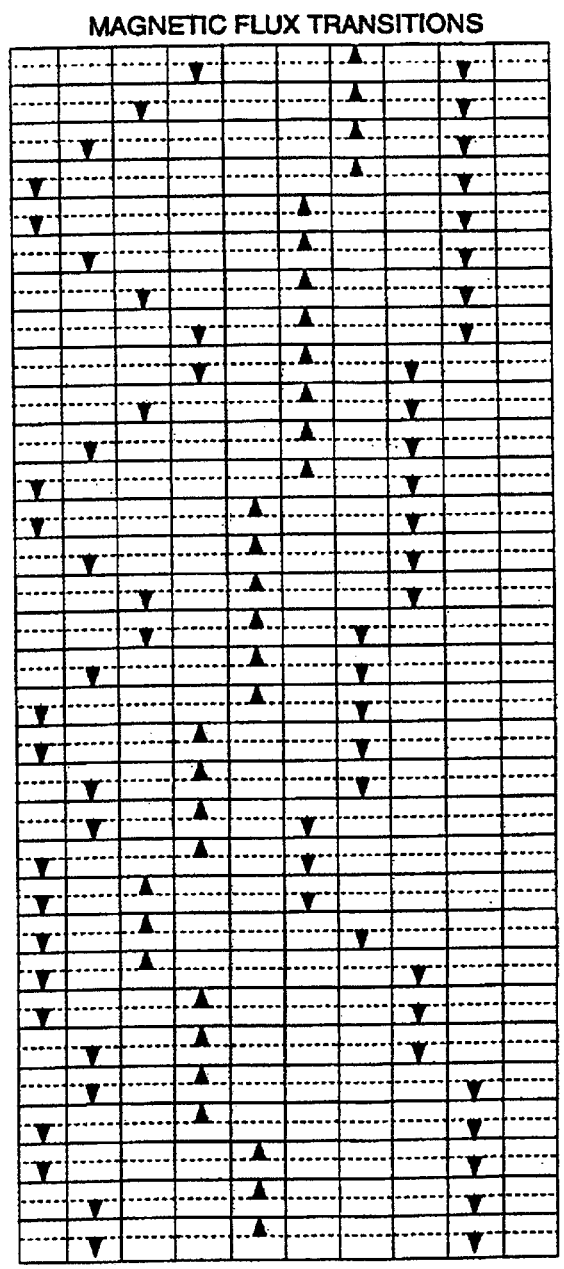
FIG. 4 shows the preferred embodiment for RLL (1,k) coding the track address into channel data at rate 5/10.

The optimum code satisfying the above constraints is shown in FIG. 4. The first column is the binary track address that is subtracted from the target track address to generate the servo control signal. The second column is the Gray code representation of the binary track address, and the third column is the encoded channel data track address actually recorded to the disk. The fourth column shows the magnetic flux transitions on the disk corresponding to the "1" bits of the channel data track address.

If the binary track address contains five bits, as shown in the first column of FIG. 4, then it is unnecessary to encode the track address into a Gray code and then into the channel data; the binary track address can be encoded directly into the channel data of column three. The intermediate step of encoding the binary track address of column one into the Gray code of column two is necessary when the binary track address comprises more than five bits. If so, the binary track address is processed in segments of five bits as discussed in further detail bellow.

The code in FIG. 4 satisfies an RLL constraint of (1,7) and has a rate of 5/10 (5 bits of Gray code encode into 10 bit codewords). Each codeword in column three comprises three "1" bits where each adjacent codeword differs by a "1" bit shifting left or right by one bit cell. The magnetic flux transitions corresponding to the "1" bits recorded on the disk differ by a single bit shift between adjacent codewords.

For a d=1 constraint, it is not possible to encode fewer than 5 bits of Gray code and achieve a code rate of 1/2 or better. And even though possible to achieve a code rate better than 1/2 by encoding more than 5 bits of the Gray code track address, the marginal increase in the code rate does not outweigh the resulting increase in decoder complexity and cost.

Figure 5:
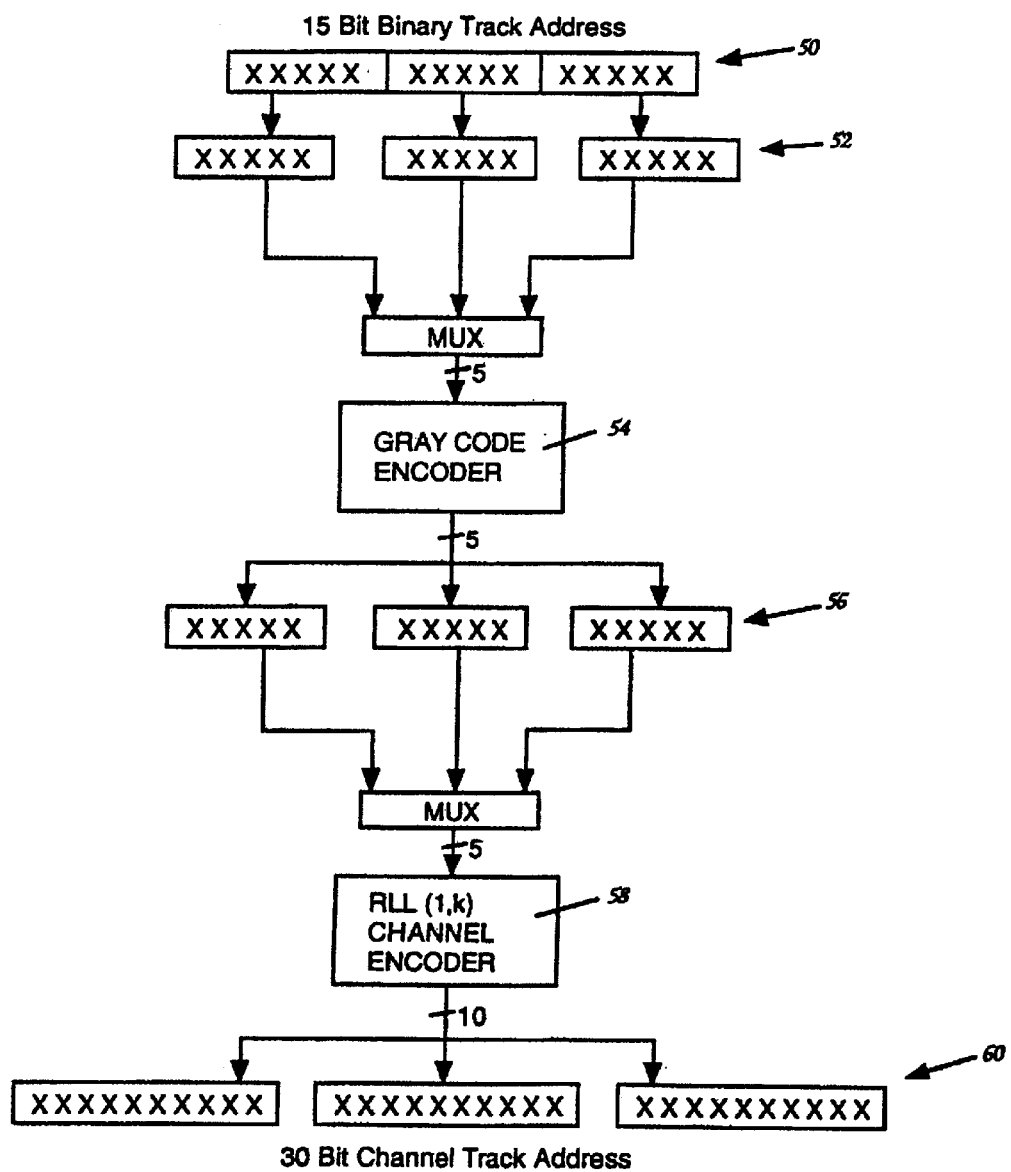
FIG. 5 illustrates a method for encoding the track address in three sections.

The encoding method of the present invention is understood with reference to FIG. 5. For this example, a 15 bit binary track address 50 is segmented into three five bit sections 52. A Gray code encoder 54 sequentially encodes each five bit section 52 into a corresponding five bit Gray code 56. Then, a d=1 channel encoder 58 sequentially encodes each of the five bit Gray codes 56 into a corresponding 10 bit codeword 60 that is recorded to the disk 4.

The intermediate step of encoding the binary track address 50 into a Gray code 56 ensures that only one of the three codeword sections 60 changes between adjacent track addresses. This is necessary to satisfy the above first constraint—to ensure that the channel codewords of adjacent track addresses are different by only two adjacent bits. Since more than one of the three binary track address sections 52 can change between adjacent track addresses (e.g., #31=00000 00000 11111 and #32=00000 00001 00000) the binary track address 52 cannot be encoded directly into the 30 bit channel track address 60. Instead, the three sections 52 of the binary track address 50 are first encoded into three Gray code sections 56 where only one of the Gray code sections changes between adjacent track address.

This is illustrated in FIG. 6 which shows a first column representing the binary track address and a second column representing the corresponding Gray code. The first 32 binary track addresses are encoded according to FIG. 4; the third Gray code column 62 in FIG. 6 represents the Gray code in the second column of FIG. 4. At the 33rd binary track address 64, the third Gray code column 62 (10000) does not change while the second column 66 changes from 00000 to 00001, the second Gray code in column two of FIG. 4. At the 34th binary track address 68, the second Gray code column 66 does not change while the third column 62 changes from 10000 to 10001, the second to last Gray code in column two of FIG. 4. The third Gray code column 62 sequences in reverse through the Gray codes in column two of FIG. 4 until the 65th binary track address 70. Again, the third Gray code column 62 (00000) does not change while the second column 66 changes from 00001 to 00011, the third Gray code in column two of FIG. 4. For the next 32 binary track addresses, the third Gray code column 62 again sequences through the Gray codes in the second column of FIG. 4. Each column of the Gray code in FIG. 6 sequences through the Gray codes in FIG. 4 in a similar manner. As a result, only one of the Gray code columns changes between adjacent track addresses, ensuring that only one of the 10 bit codewords 60 recorded to the disk changes between adjacent track addresses. Also, since each column progresses through the same sequence, the same encoder can encode all three sections. This is true even though the columns progress through the sequence at different rates.

Figure 7:
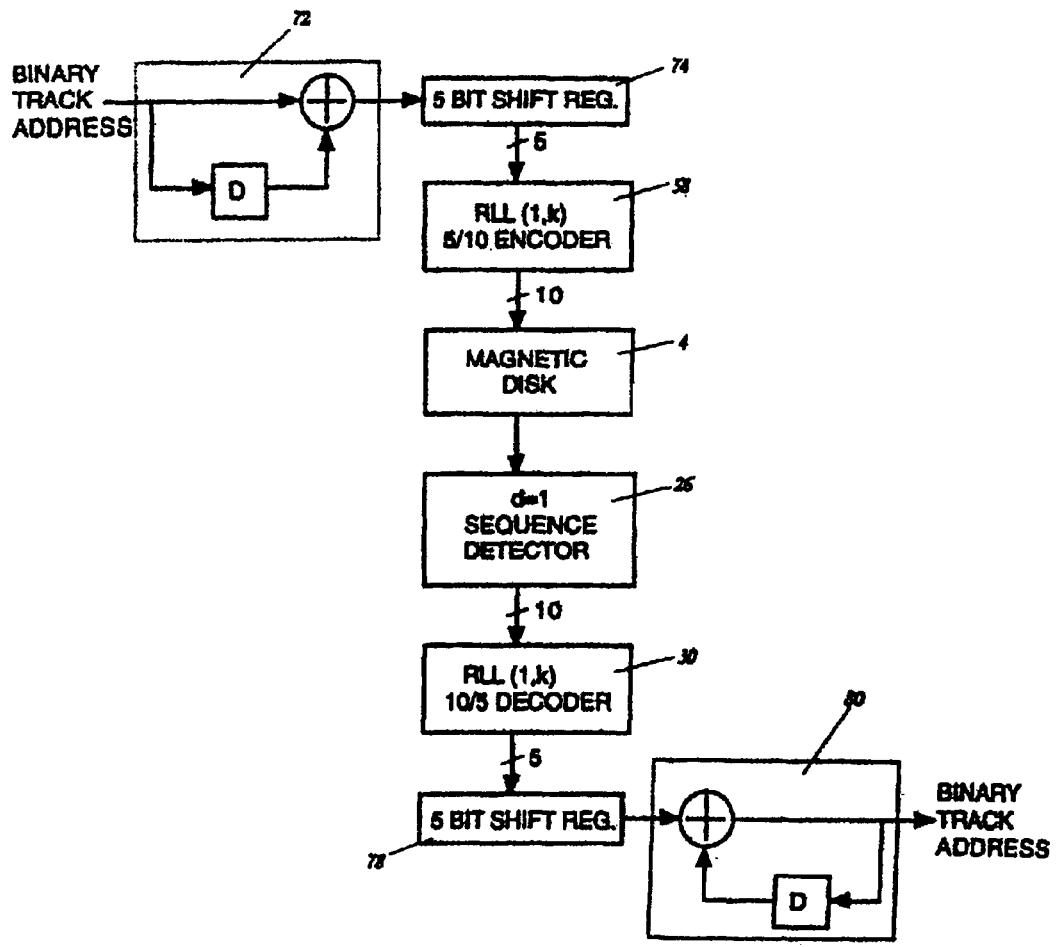
FIG. 7 shows the preferred embodiment of the present invention for encoding, detecting, and decoding the track address.

The preferred embodiment for encoding, detecting, and decoding a 15 bit binary track address is shown in FIG. 7.

A 1+D filter 72 filters the binary track address to encode it into the Gray code shown in FIGS. 4–6. The filtered address (Gray code) is shifted into a 5 bit shift register 74, and after five bits, the register's output is encoded, by a 5/10 RLL (1,k) encoder 58, into a corresponding 10 bit codeword shown in column three of FIG. 4. The codeword is recorded to the disk 4 and this process repeats for the three five bit sections of each track address.

Upon read back, the codewords recorded on the disk 4 are detected using a d=1 sequence detector 26 (and preferably a Viterbi sequence detector) and decoded, by a 10/5 RLL (1,k) decoder 30, back into its Gray code representation. The five bit output of decoder 30 is loaded into a five bit shift register 78 and shifted out serially. The output of shift register 78 is passed through a 1/(1+D) filter 80 to decode the Gray code back into the corresponding binary track address.

The system of FIG. 7 is efficient and cost effective. The 1+D filter 72 and the 1/(1+D) filter 80 are implemented with a modulo two adder and a one bit delay register. Because the track address is processed in three sections of five bits each, the complexity and cost of the 10/5 RLL (1,k) decoder 30 has been reduced. Thus, the present invention increases the data density of the storage system by detecting the track address with a d=1 sequence detector 26 and decoding the same with a cost effective d=1 decoder 30.

Many changes in form and detail could be made without departing from the spirit and scope of the present invention; the particular embodiment disclosed herein is not intended to be limiting. The scope of the invention is properly construed from the following claims.

What is claimed is:

1. Apparatus for decoding a recorded servo track address read from a magnetic storage disk, comprising:
   (a) an input connected to receive at least part of a codeword of digital data representing the recorded servo track address; and
   (b) a d>0, rate ½ servo data decoder, responsive to the codeword of digital data, for decoding the recorded servo track address into a decoded track address, wherein decoded track addresses representing adjacent track addresses differ by only two adjacent bits.

2. The apparatus for decoding a servo track address as recited in claim 1, wherein:
   (a) a plurality of recorded servo track addresses are represented by a plurality of corresponding codewords; and
   (b) all of the codewords contain the same number of "1" bits wherein each "1" bit corresponds to a magnetic flux transition on the magnetic storage disk.

3. The apparatus for decoding a servo track address as recited in claim 2, wherein:
   (a) the codeword comprises n bits; and
   (b) three out of the n bits are "1" bits and n–3 are "0" bits.

4. The apparatus for decoding a servo track address as recited in claim 3, wherein n=10.

5. The apparatus for decoding a servo track address as recited in claim 1, wherein the codeword comprises ten bits which are decoded into five bits of the decoded track address.

6. The apparatus for decoding a servo track address as recited in claim 1, wherein:
   (a) the decoder decodes the codeword in a predetermined number of sections; and
   (b) each section comprises a plurality of bits.

7. The apparatus for decoding a servo track address as recited in claim 6, wherein:
   (a) the decoded track address is a 15 bit Gray code;
   (b) the codeword comprises 30 bits;
   (c) the codeword is decoded in three 10 bit sections; and
   (d) each 10 bit section is decoded into 5 bits of the corresponding Gray code.

8. The apparatus for decoding a servo track address as recited in claim 1, wherein the decoded track address is a Gray code further comprising a 1/1+D filter for decoding the Gray code into a binary track address.

9. A read channel in a magnetic disk drive storage device for detecting and decoding RLL (1,k) encoded user data and RLL (1,k) encoded servo data recorded on a magnetic disk using a magnetic read/write head positioned there above, wherein the encoded servo data comprises a plurality of servo track addresses corresponding to a plurality of data tracks recorded on the magnetic disk, the read channel comprising:
   (a) an input connected to receive a read signal from the magnetic read/write head;
   (b) a d=1 sequence detector, responsive to the read signal, for detecting and outputting RLL (1,k) encoded user data and RLL (1,k) encoded servo data;
   (c) a first RLL (1,k) decoder for decoding the encoded user data into estimated user data; and
   (d) a second RLL (1,k) decoder for decoding an RLL (1,k) encoded servo track address into a decoded track address, wherein:
      a code rate of the encoded servo track address is equal to 1/2; and
      decoded track addresses representing adjacent track addresses differ by only two adjacent bits.

10. The read channel as recited in claim 9, wherein the sequence detector is a discrete time sampled amplitude sequence detector.

11. The read channel as recited in claim 10, wherein the sampled amplitude sequence detector is a Viterbi sequence detector.

12. The read channel as recited in claim 9, wherein:
   (a) a plurality of recorded servo track addresses are represented by a plurality of corresponding codewords; and
   (b) all of the codewords contain the same number of "1" bits wherein each "1" bit corresponds to a magnetic flux transition on the magnetic storage disk.

13. The read channel as recited in claim 12, wherein:
   (a) the codeword comprises n bits; and
   (b) three out of the n bits are "1" bits and n–3 are "0" bits.

14. The read channel as recited in claim 13, wherein n=10.

15. The read channel as recited in claim 9, wherein ten bits of the encoded servo track address are decoded into five bits of the decoded track address.

16. The read channel as recited in claim 9, wherein:
   (a) the decoder decodes the encoded servo track address in a predetermined number of sections; and
   (b) each section comprises a plurality of bits.

17. The read channel as recited in claim 16, wherein:
   (a) the decoded track address is a 15 bit Gray code;
   (b) the encoded servo track address comprises 30 bits;
   (c) the encoded servo track address is decoded in three sections each comprising 10 bits; and
   (d) each 10 bit section is decoded into 5 bits of the corresponding Gray code.

18. The read channel as recited in claim 9, wherein the decoded track address is a Gray code further comprising a 1/1+D filter for decoding the Gray code into a binary track address.

19. A method for decoding a servo track address recorded on a magnetic disk as an RLL (1,k) rate ½ codeword, comprising the steps of:
  (a) receiving a read signal from a magnetic read head positioned above the magnetic disk;
  (b) detecting a sequence of "1" and "0" bits representing the RLL (1,k) rate ½ codeword; and
  (c) decoding the RLL (1,k) rate ½ codeword into a corresponding decoded track address, wherein decoded track addresses representing adjacent track addresses differ by only two adjacent bits.

20. The decoding method as recited in claim 19, wherein:
  (a) a plurality of recorded servo track addresses are represented by a plurality of corresponding codewords; and
  (b) all of the codewords contain the same number of "1" bits wherein each "1" bit corresponds to a magnetic flux transition on the magnetic storage disk.

21. The decoding method as recited in claim 19, wherein the decoded track address is a Gray code track address, further comprising the step of decoding the Gray code track address into a binary track address using a 1/1+D filter.

* * * * *